United States Patent
Abys et al.

Patent Number: 5,675,177
Date of Patent: *Oct. 7, 1997

[54] ULTRA-THIN NOBLE METAL COATINGS FOR ELECTRONIC PACKAGING

[75] Inventors: Joseph Anthony Abys, Warren; Igor Veljko Kadija, Ridgewood; Edward John Kudrak, Jr., Clifton; Joseph John Maisano, Jr., Rockaway, all of N.J.

[73] Assignee: Lucent Technologies Inc., Murray Hill, N.J.

[*] Notice: The term of this patent shall not extend beyond the expiration date of Pat. No. 5,360,991.

[21] Appl. No.: 494,476

[22] Filed: Jun. 26, 1995

[51] Int. Cl.⁶ .................................. H01L 23/495
[52] U.S. Cl. ................... 257/666; 257/736; 257/762
[58] Field of Search ............................. 257/678, 698, 257/667, 767, 666, 736, 762, 766, 781

[56] References Cited

U.S. PATENT DOCUMENTS

| | | | |
|---|---|---|---|
| 4,911,798 | 3/1990 | Abys et al. | 204/44 |
| 4,911,799 | 3/1990 | Abys et al. | 204/44 |
| 5,178,745 | 1/1993 | Abys et al. | 205/219 |
| 5,360,991 | 11/1994 | Abys et al. | 257/767 |

FOREIGN PATENT DOCUMENTS

| | | | |
|---|---|---|---|
| 59-168659 | 3/1983 | Japan | H01L 23/48 |
| 4-115558 | 9/1990 | Japan | H01L 23/50 |
| 0 250 146 | 12/1987 | United Kingdom | H01L 23/48 |
| 0 335 608 | 4/1989 | United Kingdom | H01L 23/50 |

OTHER PUBLICATIONS

Frank H. Reed and William Goldie, "Gold Plated Technology", Electrochemical Publications Limited, 8 Barnes Street, Ayr, Scotland, 3rd Printing, 1987, pp. 26 and 46.
"Solderability", MIL-STD-883C, Notice 5, Method 2003.5, May 29, 1987.
"Standard Test Method for Porosity in Gold and Palladium Coatings by Sulfurous Acid/Vapor", ASTM Designation B799-88, Nov. 1988, pp. 463-465.

*Primary Examiner*—Tom Thomas
*Assistant Examiner*—Roy Potter
*Attorney, Agent, or Firm*—Richard J. Botos

[57] ABSTRACT

A lead frame comprising an ultra-thin composite of noble metal layers on a nickel surface is disclosed. The composite ranges from 2.5 to 11 microinches in thickness and includes in succession from nickel, a 0.5 to 3.5 microinches of palladium or gold strike, a 0.5 to 5 microinches thick palladium-nickel alloy layer having 10 to 90 weight percent nickel by weight of the alloy, a 0.5 to 5 microinches thick palladium layer, and a 0 to 1 microinch thick gold layer. The gold layer is being used whenever it is desirable to achieve high speed of solder wetting, relative to the speed of solder wetting of palladium. Viable ultra-thin coatings are most effectively obtained by deposition of the layers in a reel-to-reel metal deposition process.

21 Claims, 2 Drawing Sheets

ULTRA-THIN NOBLE METAL COATINGS FOR ELECTRONIC PACKAGING

TECHNICAL FIELD

This invention concerns a solderable ultra-thin noble metal protective coating, especially useful in packaging of integrated circuit devices.

BACKGROUND OF THE INVENTION

Integrated circuit (IC) devices, having an integrated circuit (IC) unit and a lead frame which are sealed within a protective enclosure, find wide use in products including consumer electronics, household appliances, computers, automobiles, telecommunications, robotics and military equipment. The IC unit encompasses integrated circuit chips and hybrid integrated circuit modules which include one or more of the IC chips and other electronic components on a plastic or ceramic support base.

A means to electrically interconnect an IC unit to circuitry external of the IC device takes the form of a lead frame. The lead frame is formed from a highly electrically conductive material, such as copper or copper alloy, or by stamping or etching a metal blank into a plurality of leads (or lead fingers) defining a central area in which the IC unit is mounted. The lead frame comprises typically a mounting paddle and a plurality of separate lead members extending away from a location adjacent to the paddle. In those instances where the paddle is absent, the leads are formed so that the ends of the leads are overlapping the periphery of the IC unit or the ends of the leads are positioned in an abutting or spaced position with the IC unit.

There are several attachment techniques by which the leadframes connect the IC devices in a package. These include wirebonding, soldering, die-attach and encapsulation. The most control is in wirebonding and soldering. In all instances attachment requires a particular quality of the leadframe surface. Most often this means that the surface must be oxide free and ready for interaction with other components such as gold or aluminum wire, silver filled epoxy or solder. For this to be attainable in a reproducible manner, the surface finish of the leadframe plays an important role.

Blanked lead frames are, typically, plated with a layer of nickel over the surface of the lead frame. Nickel plating was intended to serve as a barrier to diffusion of copper to and formation of reactive copper products, such as copper oxides and sulfides, on the surface of the leadframe. Unfortunately, nickel layer in thickness of less than 400 microinches (10.2 micrometers) contains pores through which migration and diffusion of copper to the surface of the lead frame takes place. However, nickel layers having thickness of greater than 400 microinches tend to crack when the leads are eventually bent.

An attempt to eliminate or at least reduce effects of diffusion of copper through a less than 400 microinches thick nickel layer was made by depositing a thin layer of palladium or palladium/nickel alloy on top of the nickel layer. (See European Patent Application No. 0 250 146 published Dec. 23, 1987). However, copper corrosion products, including oxides, sulfides and other reaction products of copper, continued to appear on the lead frame, discoloring the surface of the lead frame and degrading its wirebonding and soldering ability. A further attempt to overcome these shortcomings was made by plating the copper base with a plurality of layers including, in an ascending order from the copper base, a 5 microinch (127 nanometers) thick nickel strike layer, a 3 microinch (76 nanometers) thick palladium/nickel alloy layer, a nickel layer and a palladium layer. The nickel strike layer and the palladium/nickel alloy layer were intended to act as a barrier to copper ion migration to the surface of the lead frame so as to permit the use of a thinner (less than 400 microinches) nickel layer. (See European Patent Application No. 0 335 608 published Oct. 4, 1989). However, this combination of layers also did not lead to a product which could withstand the effects of processing steps required in the fabrication of the encapsulated devices.

Presence of nickel and nickel products, such as nickel oxide, at the surface of the leads are of greater concern from the solderability standpoint than the presence of copper and copper products. Presence of as little as 5 atomic percent or even less of nickel on the surface detrimentally affects the solderability of the surface. Nickel and nickel products, due to the effects of various processing steps, including high temperature and oxidation conditions, diffuse to and interreact with metal components of the overlaying layers. Nickel products, such as nickel oxides, interfere with soldering and bonding processes. Besides, they are difficult to remove with conventional acidic cleaning.

In U.S. Pat. No. 5,360,991 issued on Nov. 1, 1994 to J. A. Abys, et at, is described a lead frame comprising a base metal, a layer of nickel on the base metal, and a protective composite of metal layers on the nickel. The composite includes, in succession from the nickel layer, a layer of palladium strike or soft gold strike, a layer of palladium-nickel alloy, a layer of palladium and a layer of gold. The various layers are in thickness sufficient to effectively prevent migration of copper and nickel and their respective corrosion products to the surface of the lead frame, depending on the processing and use conditions especially after being subjected to processing thermal conditions exceeding 250° C. Typically the composite is deposited in a total thickness ranging from 10 to 300 microinches with gold layer being 1 to 100 microinches thick. However, it would be desirable to reduce the amounts of precious metals or even eliminate gold, while retaining the excellent solderability characteristics of the surface of the lead frame.

SUMMARY OF THE INVENTION

This problem has been solved by providing an ultra-thin composite of noble metal layers on a nickel surface. The composite ranges from 2.5 to 11 microinches in thickness and includes in succession from nickel, a 0.5 to 3.5 microinches of palladium or gold strike, a 0.5 to 5 microinches thick palladium-nickel alloy layer having 10 to 90 weight percent nickel by weight of the alloy, a 0.5 to 5 microinches thick palladium layer, and a 0 to 1 microinch thick gold layer. The gold layer is being used whenever it is desirable to achieve high speed of solder wetting, relative to the speed of solder wetting of palladium. Viable ultra-thin coatings are most effectively obtained by deposition of the layers in a reel-to-reel metal deposition process.

DETAILED DESCRIPTION

Figure 1:
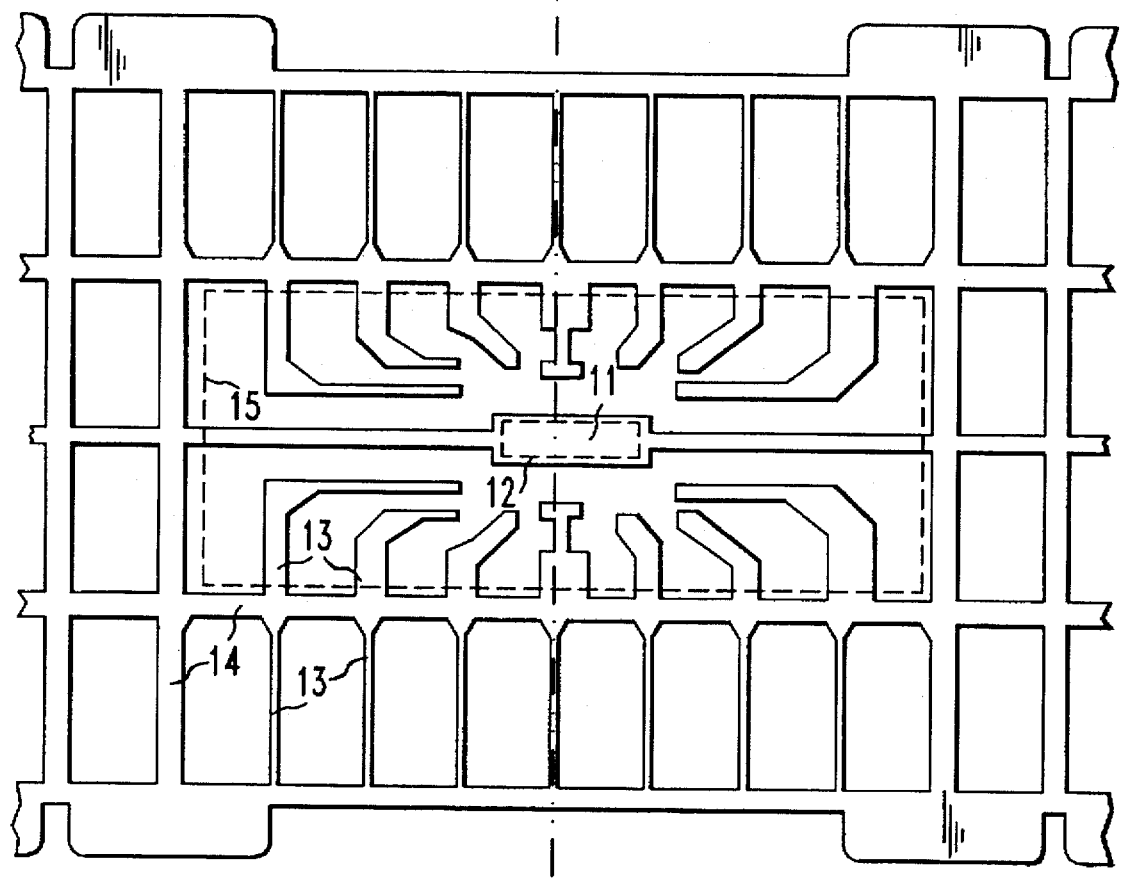
FIG. 1 is a schematic representation of a top view of a typical prior art lead frame with an IC unit mounted thereon.

FIG. 1 illustrates a top view of a typical lead frame, 10, for use with an integrated circuit (IC) unit, 11 (shown in phantom). The lead frame includes a paddle, 12, on which the IC unit is bonded, and leads, 13. Dam bars, 14, which interconnect leads 13 at this stage, are trimmed away after a packaging medium has been applied over an area shown in phantom lines, 15.

For illustration purposes, this invention will be described with reference to an IC packaging in which the packaging medium is a molded plastic material, such as epoxy. However, this invention is applicable to such other embodiments in which the IC unit and the leads are enclosed in a ceramic or a hybrid ceramic and metallic package. This invention is also applicable to printed circuit boards provided with metallic pattern on an insulating base.

Figure 2:
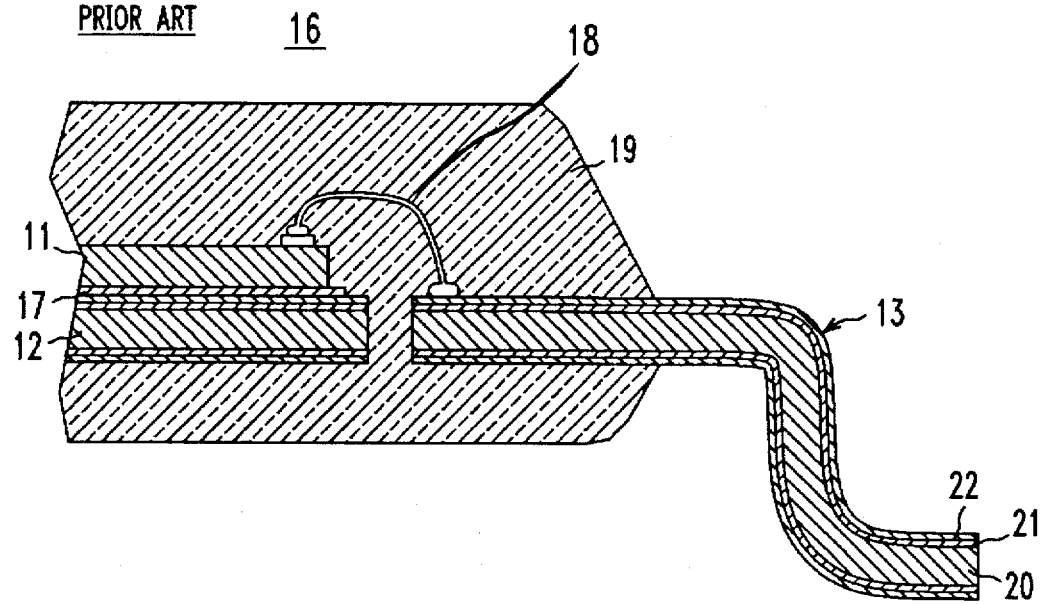
FIG. 2 is a schematic cross-sectional side view of a portion of an encapsulated device taken along the 2—2 line of FIG. 1.

In FIG. 2 is shown a schematic cross-sectional side view of a package 16. The package includes IC unit 11, paddle 12, and leads 13. The IC unit which is bonded on the paddle by solder or adhesive, 17, is electrically connected via wires or tabs 18, to the leads. IC unit 11, paddle 12, wires 18, and portions of the leads adjacent to the paddle are enclosed in a molded packaging medium, 19. The leads include a base metal, 20, a layer of nickel, 21, on the base metal, and a protective composite, 22, on the nickel layer.

The base metal, 20, is typically a copper or a copper alloy. Copper alloys, such as CDA No. 102 (99.95% Cu, remainder including Ag), CDA No. 103 (99.95% Cu, plus 0.001–0.005 P, and Au), No. 151 (99.9 Cu, 0.1% Zn), No. 155 (97.8 Cu, 0.034 Ag, 0.058 P, 0.11 Mg), No. 194 (97.5 Cu, 2.35 Fe, 0.003P, 0.12 Zn), and KLF 125 (94.55 Cu, 3.2 Ni, 1.25 Sn, 0.7 Si), are representative of the materials being used for the lead frames. Other alloys, such as iron-nickel alloys may also be used as the base metal.

Figure 3:
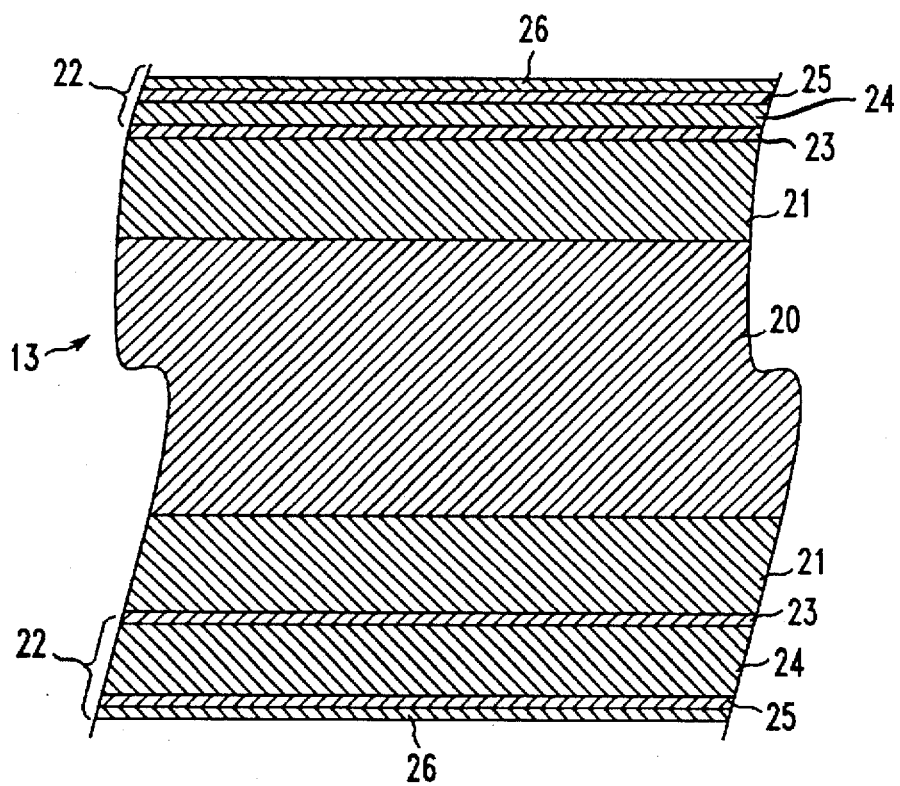
FIG. 3 is an enlarged schematic representation of a cross-section of a small longitudinal portion of the lead showing the layers of the composite plating according to the invention.

The problem of diffusion of copper, nickel and their products to the surface of the leads of the lead frame is solved by depositing on top of nickel layer 21 protective composite 22 having a multilayer structure which prevents or at least substantially reduces migration of copper and copper products and of nickel and nickel products onto the outer surface of the leads. Shown in FIG. 3, is an enlarged schematic representation of a cross-section of a portion of lead 13. Composite 22 includes, in an ascending order from nickel layer 21, a palladium or soft gold strike layer 23, a palladium-nickel alloy layer 24, and a palladium layer 25. Optionally, the composite may include a thin layer of gold, 26. The composite is deposited in a total thickness varying from about 2.5 microinches to about 11 microinches, preferably from 2.5 to 10 microinches. The composite is on a nickel layer ranging typically from 20 to 200 microinches in thickness (510 to 5100 nanometers).

Palladium or soft gold strike layer 23, which acts as a bonding (adhesive) layer between nickel and palladium-nickel alloy layer is deposited in a thickness ranging from 0.5 to 3.5, preferably from 0.5 to 3 microinches and more preferably from 1 to 3 microinches (25 to 76 nanometers). Layers thinner than 0.5 microinch may be insufficient for bonding purposes, while layers 3.5 microinches and thicker do not add any additional advantage. The Pd or Au strike layer is a low porosity layer which, in addition to its bonding characteristics, contributes to an enhancement in growth of subsequent layers with reduced porosity, which in turn contributes to the reduction in potential diffusion of copper and nickel toward upper layers. Preferably, Pd strike layer is deposited from a palladium strike solution described in U.S. Pat. No. 4,178,475 issued on Jan. 12, 1993 to J. A. Abys et al., which is incorporated herein by reference. Examples of compositions and electroplating conditions for depositing soft gold are disclosed in a book by Frank H. Reed and William Coldie, "Gold Plating Technology", Electrochemical Publications Limited, 8 Barns Street, Ayr, Scotland, Third printing 1987, pages 26 and 46.

Palladium-nickel alloy layer 24 is deposited in a thickness ranging from 0.5 to 5 microinches, preferably from 0.5 to 4 microinches and more preferably from 1 to 4 microinches (25 to 100 nanometers). Palladium nickel alloy layer, grown on the palladium or soft gold strike layer, is a low porosity layer. The main purpose of this layer is to prevent or at least reduce diffusion of copper, iron and nickel and their products, such as oxides, to the surface of the leads, especially to the surface which is to be soldered. Layers thinner than 0.5 microinches may be insufficient to act as a barrier to diffusion of copper and nickel therethrough, while layers thicker than 5 microinches do not add any additional advantage. The alloy is a Pd-Ni alloy with nickel content ranging from 10 to 90, preferably from 10 to 30 percent Ni, by weight. The alloy is deposited preferably from a palladium electroplating solution described in U.S. Pat. Nos. 4,911,798 and 4,911,799 both of which were issued on Mar. 27, 1990 to J. A. Abys et at., and both of which are incorporated herein by reference.

Palladium layer 25, is deposited in a thickness ranging from 0.5 to 5 microinches, preferably 0.5 to 4 microinches and more preferably from 1 to 4 microinches (25 to 100 nanometers). The main purpose of this layer is to further reduce effects of porosity in the under-laying layers and to prevent or at least to slow down diffusion of nickel from palladium nickel alloy layer 24 to the surface which is to be used for soldering. Layers thinner than 0.5 microinch may be insufficient to act as a barrier to the diffusion of nickel from the palladium nickel alloy layer, while layers thicker than 5 microinches do not add any additional advantages. The thickness of this layer depends on the thickness and the Ni content in the Pd-Ni alloy layer. The higher the Ni content in the Pd-Ni alloy layer, the thicker the Pd layer should be to prevent or at least to slow down the diffusion of Ni into and through the Pd layer. Palladium layer is preferably deposited from palladium electroplating solution described in U.S. Pat. No. 4,911,799 issued on Mar. 27, 1990 to J. A. Abys et al., which is incorporated herein by reference.

An optional gold layer 26 is deposited in a thickness ranging from 0 to 1 microinch (0 to 25 nanometers). The gold layer is being used when it is desirable to achieve high speed wetting of the surface with solder. In applications represented by samples Nos. 1, 2 and 3, the thin layers of Pd or Au strike, Pd-Ni alloy and Pd provide sufficient protection without the need for the use of the much more expensive gold. In applications represented by samples 4 and 5, a combination of very thin layers ranging from 0.5 to 2 microinches of Pd or Au strike, Pd-Ni alloy, and Pd layer each and of only one microinch of gold provide sufficient protection for applications below 330° C. The gold layer may be deposited from any conventional solutions for electroplating gold. Preferably, the gold layer is deposited as a soft gold from high efficiency plating solutions. Examples of compositions and electroplating conditions for depositing soft gold are disclosed in a book by Frank H. Reed and William Coldie, "Gold Plating Technology", Electrochemical Publications Limited, 8 Barns Street, Ayr, Scotland, Third printing 1987, pages 26 and 46.

When the composite is to be used in processing at 330° C. and below, and it is desirable to avoid the use of gold, Pd or Au strike layer may be deposited in a thickness of at least one microinch, the Pd-Ni alloy layer in a thickness of at least 2 microinches, and the Pd layer in a thickness of at least 1 microinch. In those instances where the use of gold is desirable to achieve high speed wetting of solder, the three layers are used in thicknesses of at least 0.5 microinch each and followed by a layer of gold about 1 microinch in thickness.

In order to obtain the viable ultra-thin coatings, the various layers are deposited by a reel-to-reel metal deposition process. This may also include deposition of the layer of nickel on the base metal in a reel-to-reel operation. Failure to follow this metal deposition requirement may lead to insufficient protection requiring much thicker metal deposits. The reel-to-reel metal deposition plating is well known in the art; therefore, no specific explanation of this process is needed.

After completing the metal deposition, the lead frames undergo the IC unit mounting process. IC units 11 are mounted on paddle portions 12 of lead frames 10 in a known manner, e.g., by solder or by an adhesive. The electrical connection is made between the IC units 11 and leads 13 by means of wires or tabs 18. It is important that the surface of the leads be bondable to the wires. A solderable surface, which is free of undesirable products of copper and/or nickel, will be also suitable for bonding of wires thereto. A surface with undesirable products of copper or nickel may not be wire bondable or may be poorly bondable so that a viable connection may not be established or if established it could become disconnected in operation. Especially poor contact would be made if the outer surface of the lead at the place of bond has a thin layer of nickel oxide. Copper products, such as oxides and sulfides, are removable by cleaning the surface prior to the IC unit mounting, wire bonding and soldering. However, such nickel by-products as nickel oxides are quite tenacious and are hard to remove with conventional cleaning solutions.

After the IC and wire bonding processing steps, each assembly is placed in a molding apparatus, and plastic encapsulating material is injected around each IC unit and adjacent parts of the leads and forms an external IC unit package. After removing the assembly from the molding apparatus, the molded IC packages are separated from the lead frames by separating the ends of the leads from the lead frame and by removing dam portions between the leads. The leads are then bent into a desirable configuration, e.g., gull wing, "J" or butt form. Portions of the leads exposed from the molding compound are cleaned by organic solvents and plasma and soldered to pads on a mounting board. In one instance the cleaned leads are placed in contact with solder bumps or solder paste on the mounting board and are soldered to pads on the mounting board by refluxing. In another instance, the cleaned leads are immersed into a molten bath of solder and then are placed in contact with fluxed terminal pads on the mounting board.

It is imperative that to have reliable connection between the IC unit and the mounting board, the leads should have solderable surface. This means that the surface of these portions of the leads which are to be secured to pads on the board should be capable to receive a substantially continuous coating of solder. A surface with a solder coating covering 95% or more of the area to be soldered is acceptable as being solderable. Also, the surface should have a solder coverage with a low count of pores per square centimeter, such as fewer than 28-30, preferably fewer than 25 pores per square centimeter.

In the process of fabricating the encapsulated device, the lead frame undergoes numerous processing operation steps including those which contribute to oxidation, interdiffusion contamination, contamination by vapors, cracking, and contamination surface damaging. The processing steps include injection molding of thermoplastic material to form a plastic frame (150° C., 30 minutes), circuit attachment, heat spreader attachment (150° C., 30 minutes), trim and form leads, oxygen plasma clean or laser $H_2O_2$ clean to remove any organic impurities, device attachment including die bond epoxy cure (165° C., 1 hour), cover attach (165° C., 1 hour), and burn-in (125° C./24 hours) to effect structure stress release and integrity test. These processing steps are well known in the art and do not need any further detailing. Formation of plastic molded packaging and soldering steps may involve temperatures as high as 250° C.

To determine whether or not the surface of the lead frame would be suitable for a reliable connection, the lead frames with or without the encapsulating material are subjected to reliability tests including wirebonding and solderability tests. Wirebonding tests are performed to verify the reproducibility and the reliability of this type of bond. AT&T standard A-87AL1917, for example, identifies mode of failure and acceptance criteria. Industrial users typically test the wirebonding including pretreatments such as thermal aging or plasma cleaning steps. One of the solderability tests is a Military Specification 883C, Method 2003 which is used as a qualifying criterion for acceptability. This standard involves steam aging at 95° C. and 95% relative humidity for 4, 8 or 16 hours. This is presumed to simulate a shelf life of at least 6 months. Thereafter, the samples are subjected to an application of non-activated rosin-flux to exposed metal leads and immersion in solder at 250° C. for 5 seconds. Samples are then evaluated for solder coverage at 10×magnification. Coatings to be solderability acceptable must have at least 95% coverage of high-quality smooth solder with a porosity count of fewer than 28-30, preferably fewer than 25 pores per square centimeter. Although developed for typical solder finishes, the steam aging test method is applicable in testing nonsolder finished substrates as well. The testing is conducted as if the surface being tested would receive a coating of solder. The porosity testing is conducted using $SO_2$ vapor as outlined in ASTM B799-88, November 1988, pages 463-465.

Soldering is determined to be one of most sensitive steps in electronic packaging when exposed to thermal excursions, oxygen and organics which can cause deterioration of the finish. The result is an absence of solderability and product failure. With this in mind, a series of multilayer finishes with ultra-thin protective coatings were tested to determine whether or not they can withstand higher temperatures and other environmental attack such as plasma treatments and still remain solderable. Compositions in the range of total thickness of from 2.5-11 microinches are shown to provide excellent wirebonding properties. Some fusion was applied to SMT boards and also demonstrated good performance even after $O_2$ plasmal treatments.

Since many applications include thermal exposure of the coated lead frame, diffusion of metal between the layers under thermal aging conditions may cause a loss of surface quality if the underlying metal diffuses into the more noble surface layer, e.g., nickel into gold. Therefore, in addition to steam aging, it is desirable to subject the plated surfaces to a thermal aging. Standardized thermal aging requirements do not exist at the present time. In order to judge the suitability of the coatings according to this invention for solderability under different thermal conditions, the coatings were subjected to thermal testing at 200° C. for a period of 1, 2 and 5 hours, at 250° C. for a period of 5, 10 and 15 minutes and at 330° C. for one and two minutes.

The thermal testing was conducted on copper panels having a nickel layer coated with a composite having a total thickness ranging from 2.5 to 11 microinches. The thicknesses of the nickel layer and of the layers of composite 22 are shown in Table I. The composite included, in succession from the nickel layer, a Pd strike layer, a Pd-Ni (80/20) alloy layer, and a Pd layer and, optionally, gold layer. These samples were produced in a reel-to-reel plating line. The samples had greater than 98% solder coverage, as plated. The samples retained its >98% solder coverage when thermally treated at 200° C. for a period of 1, 2 and 5 hours, at 250° C. for a period of 5, 10 and 15 minutes and at 330° C. for a period of one minute. The solder coverage also remained as high (>98%) when the sample was steam aged (95° C., 95% humidity) for 8 hours. However, exposure to thermal aging at 330° C. for two minutes, resulted in solder coverage of less than 90 percent.

In Table 1 is shown a variety of compositions of ultra-thin protective coatings. In Table 2 are shown examples of performances obtained with these finishes. In Table 2, P stands for "Pass" and denotes >95% Solderability Coverage, M stands for "Marginal" and denotes percentage of P which is not reproducible and F stands for "Failure" and denotes <95% Solderability Coverage.

TABLE 1

Test Matrix of Multilayer Finishes

| Sample | Ni (μ") | Pd Strike (μ") | PdNi (μ") | Pd (μ") | Au (μ") |
|---|---|---|---|---|---|
| 1 | 36–43 | 2–3 | 3–4 | 3–4 | 0 |
| 2 | 33–44 | 2–3 | 3–4 | 2–3 | 0 |
| 3 | 29–41 | 1–2 | 2–3 | 1–2 | 0 |
| 4 | 20–28 | 0.5–1 | 0.5–1 | 0.5–1 | 1 |
| 5 | 28–34 | 1–2 | 1–2 | 1–2 | 1 |

TABLE 2

Solderability of Multilayer Finishes Thermal Aging Effect

| | Temperature | | | | | | | |
|---|---|---|---|---|---|---|---|---|
| | 200° C. | | | 250° C. | | | 330° C. | |
| Time (min) | 60 | 120 | 300 | 5 | 10 | 15 | 1 | 2 |
| Sample # | | | | | | | | |
| 1 | P | P | P | P | P | | P | F |
| 2 | P | P | P | P | P | | P | F |
| 3 | P | P | F | P | P | | P | F |
| 4 | | | | P | P | P | P | M |
| 5 | | | | P | P | P | P | M |

Multilayer finishes can be designed to pass wirebonding and solderability tests of products exposure to meet a wide range of thermal and "cleaning" treatments of the substrates. Samples 1, 2, 3, 4, and 5 show excellent solderability up to 5 hours at 250° C. Samples 1, 2, 3, 4 and 5 show also acceptable solderability after thermal testing at 330° C. for 1 minute. The latter two compositions (samples 4 and 5) include a hyper-thin gold coating over the multilayer palladium finish. The benefit of this modification largely outweigh the added cost since the solder wetting speed of one second or less can be maintained in some instances even following aging test. These finishes are quite economical and yet meet the substrate temperature requirement for high speed wirebonding.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. An IC package comprising at least one IC unit, and leads sealed within a protective package, in which said leads comprise a base metal, a layer of nickel on the base metal, and a composite of metal layers on top of nickel, said composite is deposited in a thickness ranging from 2.5 to 11 microinches, the composite including, in succession from nickel, a 0.5 to 3.5 microinches thick palladium or soft gold strike layer, a 0.5 to 5 microinches thick palladium-nickel alloy layer having 10 to 90 weight percent nickel, by weight, a 0.5 to 5 microinches thick palladium layer, and a 0 to 1 microinch thick gold layer.

2. The IC package of claim 1, in which said palladium or gold strike layer is 0.5–3 microinches in thickness, said palladium-nickel alloy layer is 0.5–4 microinches in thickness, said palladium layer is 0.5–4 microinches in thickness, and said outer gold layer ranges from zero to one microinch is in thickness.

3. The IC package of claim 1, in which said palladium or soft gold strike layer is 1–3 microinches thick, said palladium-nickel alloy layer is 2–4 microinches thick, and said palladium layer is 1–4 microinches thick.

4. The IC package of claim 1, in which said palladium or soft gold strike layer is 0.5–2 microinches in thickness, said palladium-nickel alloy layer is 0.5–2 microinches in thickness, said palladium layer is 0.5–2 microinches in thickness, and said outer gold layer is about one microinch in thickness.

5. The IC package of claim 1, in which said base metal comprises copper and said Pd-Ni alloy contains 20 weight percent nickel.

6. The IC package of claim 1, in which said outer gold layer comprises soft gold strike.

7. The IC package of claim 1, in which said metal layers are deposited in a reel-to-reel plating deposition process.

8. A lead frame for providing an electrical contact to an integrated circuit unit, comprising a plurality of leads electrically connected to the integrated circuit, each lead comprising a base metal, a nickel layer on the base metal, and a composite of metal layers deposited on the nickel layer, wherein said composite is from 2.5 to 11 microinches thick, the comprising in succession from the nickel layer a 0.5 to 3.5 microinches thick palladium or soft gold strike layer, a 0.5 to 5 microinches thick palladium-nickel alloy layer having from 10 to 90% nickel, by weight, a 0.5 to 5 microinches thick palladium layer, and a 0 to 1 microinch thick gold layer.

9. The lead frame of claim 8, in which said palladium strike layer is 0.5–3 microinches in thickness, said palladium-nickel alloy layer is 0.5–4 microinches in thickness, said palladium layer is 0.5–4 microinches in thickness, and said outer gold layer is ranges for zero to one microinch is in thickness.

10. The lead frame of claim 8, in which said palladium or soft gold strike layer is 1–3 microinches thick, said palladium-nickel alloy layer is 2–4 microinches thick, and said palladium layer is 1–4 microinches thick.

11. The lead frame of claim 8, in which said palladium or soft gold strike layer is 0.5–20 microinches in thickness, said palladium-nickel alloy layer is 0.5–2 microinches in thickness, said palladium layer is 0.5–2 microinches in thickness, and said outer gold layer is about one microinch in thickness.

12. The lead frame of claim 8, in which said base metal comprises copper and said Pd-Ni alloy contains 20 weight percent nickel.

13. The lead frame of claim 8, in which said outer gold layer comprises soft gold strike.

14. The lead frame of claim 8, in which said layers are deposited in a reel-to-reel plating deposition process.

15. An article of manufacture comprising a base metal, a layer of nickel upon the base metal, and a composite of layers on the nickel layer, said composite being from 2.5 to 11 microinches in thickness and including, in succession from the nickel layer, a 0.5 to 3.5 microinches thick palladium or soft gold strike layer, a 0.5 to 5 microinches thick palladium-nickel alloy layer having from 10 to 90% nickel by weight, a 0.5 to 5 microinches palladium layer, and a 0 to 1 microinch thick gold layer.

16. The article of claim 15, in which said palladium or soft gold strike layer is 0.5–3 microinches in thickness, said palladium-nickel alloy layer is 0.5–4 microinches in thickness, said palladium layer is 0.5–4 microinches in thickness, and said outer gold layer is ranges from zero to one microinch in thickness.

17. The article of claim 15, in which said palladium or soft gold strike layer is 1–3 microinches thick. Said palladium-nickel alloy layer is 2–4 microinches thick, and said palladium layer is 1–4 microinches thick.

18. The article of claim 15, in which said palladium or soft gold strike layer is 0.5–2 microinches in thickness, said palladium-nickel alloy layer is 0.5–2 microinches in thickness, said palladium layer is 0.5–2 microinches in thickness, and said outer gold layer is about one microinch in thickness.

19. The article of claim 15, in which said base metal comprises copper and said Pd-Ni alloy contains 20 weight percent nickel.

20. The article of claim 15, which said outer gold layer comprises soft gold strike.

21. The article of claim 15, in which said metal layers are deposited in a reel-to-reel plating deposition process.

* * * * *